(12) United States Patent
Amer et al.

(10) Patent No.: US 11,705,663 B2
(45) Date of Patent: Jul. 18, 2023

(54) OUTDOOR POWER SUPPLY SYSTEM WITH A PROTECTIVE CONNECTION SYSTEM

(71) Applicant: ELTEK AS, Drammen (NO)

(72) Inventors: Christine Amer, Drammen (NO); Erik Myhre, Drammen (NO); Håkon Hafnor, Drammen (NO); Jan Tore Brastad, Drammen (NO); Kjetil Hagen, Drammen (NO)

(73) Assignee: ELTEK AS, Drammen (NO)

( * ) Notice: Subject to any disclaimer, the term of this patent is extended or adjusted under 35 U.S.C. 154(b) by 72 days.

(21) Appl. No.: 17/354,745

(22) Filed: Jun. 22, 2021

(65) Prior Publication Data

US 2021/0399463 A1    Dec. 23, 2021

(30) Foreign Application Priority Data

Jun. 23, 2020  (EP) ...................................... 20181661

(51) Int. Cl.
  *H01R 13/73*  (2006.01)
  *H01R 13/52*  (2006.01)
  *H01R 13/422*  (2006.01)
  *H05K 7/20*   (2006.01)

(52) U.S. Cl.
  CPC ....... *H01R 13/5202* (2013.01); *H01R 13/422* (2013.01); *H05K 7/20409* (2013.01)

(58) Field of Classification Search
  CPC .............. H01R 13/5202; H01R 13/422; H05K 7/20409
  USPC ........................................................ 439/559
  See application file for complete search history.

(56) References Cited

U.S. PATENT DOCUMENTS

| | | | | |
|---|---|---|---|---|
| 6,028,769 A | * | 2/2000 | Zurek | H04Q 1/155 361/732 |
| 6,736,648 B2 | * | 5/2004 | Terunuma | H01R 9/226 439/76.2 |
| 6,990,715 B2 | * | 1/2006 | Liu | A61F 13/15772 29/430 |
| 7,021,974 B2 | * | 4/2006 | Sichner | H01R 13/514 439/732 |
| 7,643,309 B1 | * | 1/2010 | Lebo | H05K 7/20545 361/752 |

(Continued)

FOREIGN PATENT DOCUMENTS

CN     208706702 U    4/2019

OTHER PUBLICATIONS

European Search Report of EP20181661.

(Continued)

*Primary Examiner* — Abdullah A Riyami
*Assistant Examiner* — Vladimir Imas
(74) *Attorney, Agent, or Firm* — J.C. Patents

(57) ABSTRACT

The present disclosure relates to a power supply system (1) including a main unit (10) including a protective main housing (11) and a distribution circuit (20) disposed in the protective main housing (11) and a module unit (30) including a protective module housing (31) and a converter module (40) disposed in the protective module housing (31). A protective connection system (CS) is configured to provide a releasable connection between the module unit (30) and the main unit (10); wherein the protective connection system (CS) includes a first connector device (15), a second connector device (35) and a sealing element (53).

18 Claims, 15 Drawing Sheets

(56) References Cited

U.S. PATENT DOCUMENTS

| | | | | |
|---|---|---|---|---|
| 8,639,392 B2* | 1/2014 | Chassin | | G06Q 30/08 |
| | | | | 705/26.4 |
| 8,657,630 B1 | 2/2014 | Nelson | | |
| 8,803,206 B1* | 8/2014 | Or-Bach | | H01L 23/34 |
| | | | | 257/355 |
| 8,946,567 B2* | 2/2015 | Nakatsu | | H02M 7/003 |
| | | | | 174/547 |
| 9,249,936 B2* | 2/2016 | Verghade | | F17D 1/04 |
| 9,407,163 B2* | 8/2016 | Nakatsu | | H02M 7/44 |
| 9,485,891 B2* | 11/2016 | Huesgen | | H05K 5/0091 |
| 9,729,076 B2* | 8/2017 | Nakatsu | | H05K 7/20927 |
| 10,348,214 B2* | 7/2019 | Nakatsu | | B60L 50/64 |
| 10,374,398 B2* | 8/2019 | Strømsvik | | H02B 1/28 |
| 10,499,544 B1* | 12/2019 | Rahm | | H05K 5/0226 |
| 10,609,825 B1* | 3/2020 | Kruse | | H05K 7/20409 |
| 10,651,054 B2* | 5/2020 | Or-Bach | | H01L 27/0688 |
| 10,742,031 B2* | 8/2020 | Rainbow | | H05K 7/1457 |
| 10,840,222 B2* | 11/2020 | Or-Bach | | H01L 27/092 |
| 11,139,748 B2* | 10/2021 | Nakatsu | | B60L 50/64 |
| 2005/0186857 A1 | 8/2005 | Sichner | | |
| 2005/0280964 A1* | 12/2005 | Richmond | | H02J 3/14 |
| | | | | 361/62 |
| 2015/0116937 A1* | 4/2015 | Huesgen | | H05K 5/0091 |
| | | | | 361/696 |
| 2016/0120059 A1* | 4/2016 | Shedd | | F28D 21/00 |
| | | | | 165/244 |
| 2019/0104644 A1* | 4/2019 | Shoji | | H04B 7/26 |
| 2019/0141861 A1* | 5/2019 | Shedd | | F28F 13/02 |
| 2019/0357647 A1* | 11/2019 | Kilmer | | C09D 11/50 |
| 2020/0305270 A1* | 9/2020 | Kim | | H01L 23/467 |
| 2021/0029819 A1* | 1/2021 | Yoo | | H01Q 1/02 |
| 2021/0110169 A1* | 4/2021 | Rupp | | H05K 5/0204 |
| 2021/0210879 A1* | 7/2021 | Jerjian | | H05B 3/06 |
| 2021/0378137 A1* | 12/2021 | Chehade | | H05K 7/209 |
| 2021/0400847 A1* | 12/2021 | Myhre | | H05K 7/1432 |

OTHER PUBLICATIONS

XP055738977: "Chameleon PS Systems Documentation", Eltek, Dec. 2, 2014, XP055738977, Retrieved from the Internet: URL: https://www.eltek.com/globalassets/imported-documents/open/UDOC-356848.003-1 -1s-1.pdf.

* cited by examiner

OUTDOOR POWER SUPPLY SYSTEM WITH A PROTECTIVE CONNECTION SYSTEM

CROSS-REFERENCE TO RELATED APPLICATION

This application claims priority to European Patent Application No. 20181661.8, filed on Jun. 23, 2020, which is hereby incorporated by reference in its entirety.

TECHNICAL FIELD

The present disclosure relates to an outdoor power supply system including a protective connection system.

BACKGROUND

Outdoor power supply systems are commonly used to supply power to outdoor power consuming systems. One example of such outdoor power consuming systems is telecom equipment, such as telecom base stations. Such a telecom base station is typically supplied with a 48V direct current (DC) voltage delivered from a power supply system located adjacent to, or in the proximity of, the base station.

The power supply system may include an alternating current (AC)/DC converter for converting an AC voltage from the AC mains (or a fossil-fueled AC generator etc.).

Alternatively, the power supply system may include a DC/DC converter for converting a DC voltage (from a solar panel system, or another type of DC power source).

The power supply system may further include rechargeable batteries to provide UPS (uninterrupted power supply) functionality.

The outdoor power supply system further includes a cabinet in which electrical equipment is protected from the environment. The cabinet provides protection from fine particles (dust, sand etc.) and humidity (rain, snow etc.). FIG. 1 shows one such prior art cabinet, referred to as the Type 4 Outdoor cabinet and described in the datasheet "Outdoor telecom power cabinet (Type 4)" issued by Eltek ASA. This cabinet has an IP code 55 (Ingress Protection code as defined in IEC standard 60529). Power cables, such as AC or DC input power cables and DC output cables, are guided between the inside and outside of the cabinet through its top side or bottom side.

FIG. 2a shows a prior art AC/DC converter module referred to as the Eltek Flatpack 2 SHE converter and described in the brochure "SHE is so cool: Efficiency taken to the next level". There are today two versions, supplying 2000 W and 3000 W respectively. The converter has a power efficiency of about 98%. The electrical and electronic components of the converter module is provided within a cover, as indicated in FIG. 2a. The purpose of the cover is to provide protection against electrical shock and for EMI purposes. One or several such converters may be mounted in a rack within the cabinet shown in FIG. 1.

As the converter and other parts of the power supply system generates heat, a cooling system is needed to cool the air within the cabinet. The cooling system may be a heat exchanger, an air conditioner or a fan-filter. The cooling system has several disadvantages; it reduces the overall power efficiency, it increases the size of the cabinet, it increases the costs of the overall power supply system and it reduces the reliability of the overall system. As shown in FIG. 2a, also the converter itself has a fan on its front side to provide a cooling air flow through the converter.

FIG. 2b shows a prior art AC/DC converter where a power converter module as in FIG. 2a is provided within a metal housing with cooling fins. The housing has an IP65 rating. This AC/DC converter is marketed by Eltek ASA under the name "Chameleon" and is described in the datasheet "Chameleon Standalone 48/650 HE". This converter is passively cooled and hence has a reduced cost due to the lack of an active cooling system. The housing is made of an extruded aluminum alloy, where the printed circuit board (PCB) with all its electrical components is inserted into either the top end opening or the bottom end opening of the housing. The end openings are thereafter closed by a top cover and a bottom cover, the bottom cover including cable connectors for input/output power. This AC/DC converter has an increased manufacturing cost due to the cumbersome assembly procedure.

FIG. 2c shows a prior art AC/DC power system including two converters of FIG. 2b connected together as a power core, the system further including a battery unit. This AC/DC power system is marketed by Eltek ASA and is described in the datasheet "Chameleon PS SystemsCompact-based Power Supply System". It is also vulnerable for theft and vandalism. The system is also limited in how much power it can supply. This system also has a increased manufacturing cost.

One object of the present disclosure is to provide a power supply system with a simple and cost efficient protective connection system for electrically and mechanically connecting converter modules together. A further object is to provide a power supply system with a heat-conductive protective connection system.

SUMMARY

In the present disclosure, a power supply system of an embodiment is disclosed. The power supply system includes:
- a main unit including a protective main housing and a distribution circuit disposed in the protective main housing;
- a module unit including a protective module housing and a converter module disposed in the protective module housing;
- a protective connection system configured to provide a releasable connection between the module unit and the main unit;
- wherein the protective connection system includes a first connector device, a second connector device and a sealing element;
- wherein the first connector device includes:
- a first mechanical connector configured to be secured to the protective main housing;
- a first electrical connector configured to be connected to the distribution circuit;
- a first sealing surface circumferentially surrounding the first mechanical connector and the first electrical connector;
- wherein the second connector device includes:
- a second mechanical connector configured to be secured to the protective module housing;
- a second electrical connector configured to be connected to the converter module;
- a second sealing surface circumferentially surrounding the mechanical connector and the electrical connector;
- wherein, when the module unit and the main unit are connected to each other:

the first and second mechanical connectors are connected to each other;

the first and second electrical connectors are connected to each other; and the sealing element is sealingly engaged between the first and second sealing surfaces.

As used herein, the term "including" means to include one or more technical features. This does not exclude the presence of other features.

In one embodiment, the second mechanical connector includes a securing opening; the first mechanical connector includes a securing element being secured to the securing opening when the module unit and the main unit are connected to each other; and the securing element is accessible from within the protective main housing.

In one embodiment, the securing opening is a threaded opening and the securing element is a threaded bolt or screw.

In yet an alternative, the securing opening is provided as part of the first mechanical connector and the securing element is provided as part of the second mechanical connector. In this alternative, the securing element is accessible from within the protective module housing.

In one embodiment, the first mechanical connector includes a guiding opening and the second mechanical connector includes a guiding element being inserted into to the guiding opening when the module unit and the main unit are connected to each other.

In one embodiment, there are more than one guiding opening and guiding element.

Alternatively, the guiding opening is provided as part of the second mechanical connector and the guiding element is provided as part of the first mechanical connector.

By means of the securing opening and the securing element it is achieved that the first connector device and second connector device can be secured to each other. Moreover, as the securing element is only accessible from within the housing, the risk of theft or tampering is reduced.

By means of the guiding opening and the guiding element, improved rigidity is achieved. Hence, relative movement between the first and second connector devices reduced considerably or is prevented. In addition, the guiding opening and the guiding element makes it easier to position the first and second connector devices correctly with respect to each other during connection.

The distribution circuit and the converter module typically include electric and electronic components soldered to a printed circuit board. Such printed circuit boards will easily be damaged if they are bent. According to the connection system of the power supply system above, mechanical rigidity is ensured.

In one embodiment, the first electrical connector is touch proof. Consequently, an operator may connect the first and second connector devices to each other or disconnect the first and second connector devices from each other, even if the distribution circuit is supplied with power.

In one embodiment, the first sealing surface is provided as a part of the protective main housing and the second sealing surface is provided as a part of the protective module housing.

In one embodiment, the first sealing surface is provided as part of a groove in the protective main housing; and the second sealing surface is provided as a ridge protruding from the second protecting housing.

In one embodiment, the ridge is protruding from the second protecting housing towards the groove when the module unit and the main unit are connected to each other.

In one embodiment, the first connector device includes a first heat-conducting element; the second connector device includes a second heat-conducting element; wherein the first and second heat-conducting elements are provided in contact with each other when the module unit and the main unit are connected to each other.

In one embodiment, the first heat-conducting element is circumferentially surrounding the first sealing surface and the second heat-conducting element is circumferentially surrounding the second sealing surface. Alternatively, the first sealing surface is provided circumferentially surrounding first heat-conducting element and the second sealing surface is provided circumferentially surrounding the second heat-conducting element. In one aspect, the first heat-conducting element is provided vertically below the second heat-conducting element during operation of the power supply system.

In one embodiment, the first heat-conducting element is provided as a part of the protective main housing and the second heat-conducting element is provided as a part of the protective module housing.

In one embodiment, the second connector device includes a lip circumferentially surrounding the second heat-conducting element, where the lip is protruding in an axial direction away from the second sealing surface.

In one aspect, the lip is at least partially circumferentially surrounding the first heat-conducting element.

By means of the heat-conducting elements being circumferentially surrounding the sealing surfaces, humidity will to a large extent be prevented from accessing the sealing element. Hence, the risk of humidity to get past the sealing element is very low.

In one embodiment, during operation of the power supply system, the first connector device is provided on a top face of the protective main housing and the second connector device is provided on a bottom face of the protective module housing.

In one embodiment, during operation of the power supply system, the first mechanical connector and the first electrical connector are facing upwardly and the second mechanical connector and the second electrical connector are facing downwardly.

In one embodiment, during operation of the power supply system, the first and second sealing surfaces are oriented in a horizontal plane.

In one embodiment, the first connector device includes a first ventilation channel; and the second connector device includes a second ventilation channel aligned with the first ventilation channel when the module unit and the main unit are connected to each other.

In one embodiment, the system further includes a passive cooling system for cooling of the main unit and the module unit.

In one embodiment, the passive cooling system includes cooling fins provided on the outer surface of the protective module housing.

In one embodiment, the passive cooling system is a passive air cooling system, where heat generated by the power supply system is transferred to the surrounding air.

In one embodiment, the power supply system is an outdoor power supply system. The protective housings are protecting the inside of the housings from the outdoor environment.

In one embodiment, the protective module housing is made of a heat-conductive material. In one aspect, also the protective main housing is made of a heat-conductive material. Preferably, the material is a weather-resistant metal suitable for the outdoor environment. The material may be aluminum or an aluminum alloy.

Hence, the protective module housing itself is a part of the passive cooling system. Also the protective main housing may be considered to be a part of the passive cooling system.

In one embodiment, the converter module is an active power converter module, i.e. the module includes actively controlled switches controlled by a control circuit.

In one embodiment, the first mechanical connector includes a first part of a mechanical coding system; the second mechanical connector includes a second part of the mechanical coding system; wherein connection of the module unit to the main unit is possible only if the first part of the mechanical coding system fits the second part of the mechanical coding system.

In one embodiment, the power supply system includes a further connection system configured to provide a releasable connection between the main unit and a further module unit, the further module unit including a protective module housing and a rechargeable battery module disposed in the protective module housing. The further connection system is preferably identical to the connection system.

The above power supply system only needs the passive cooling system during operation of the power supply system, i.e. when the converter module is supplied with electric power and is performing active power conversion. During manufacturing, transportation, storage etc., that is before the power supply system is installed and power is turned on, no heat is produced, and no cooling is needed. The term "during operation of the power supply system" is therefore used herein to specify preferred, but not necessarily essential, technical features relevant when the power is turned on. During operation of the power supply system, the module unit and the main unit are connected to each other.

BRIEF DESCRIPTION OF THE DRAWINGS

Embodiments of the disclosure will now be described in detail with respect to the enclosed drawings, wherein.

DETAILED DESCRIPTION OF THE EMBODIMENTS

Figure 1:
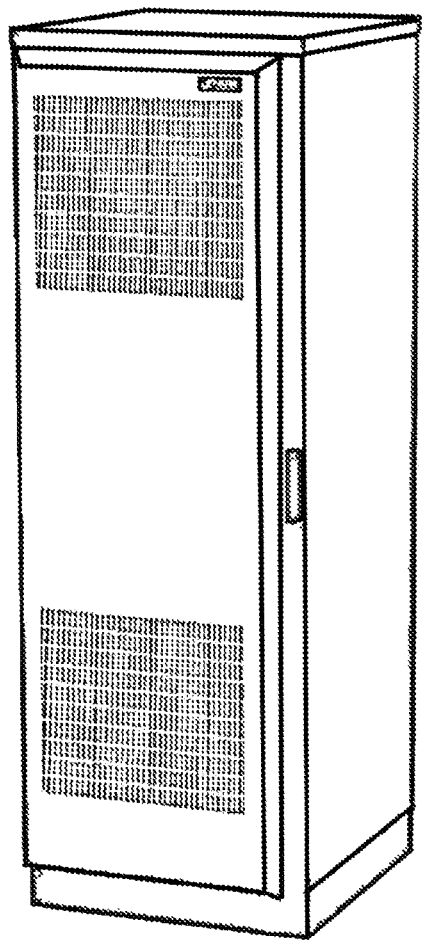
FIG. 1 shows a prior art housing of an outdoor power supply system, the housing being a cabinet.
Figure 2A:
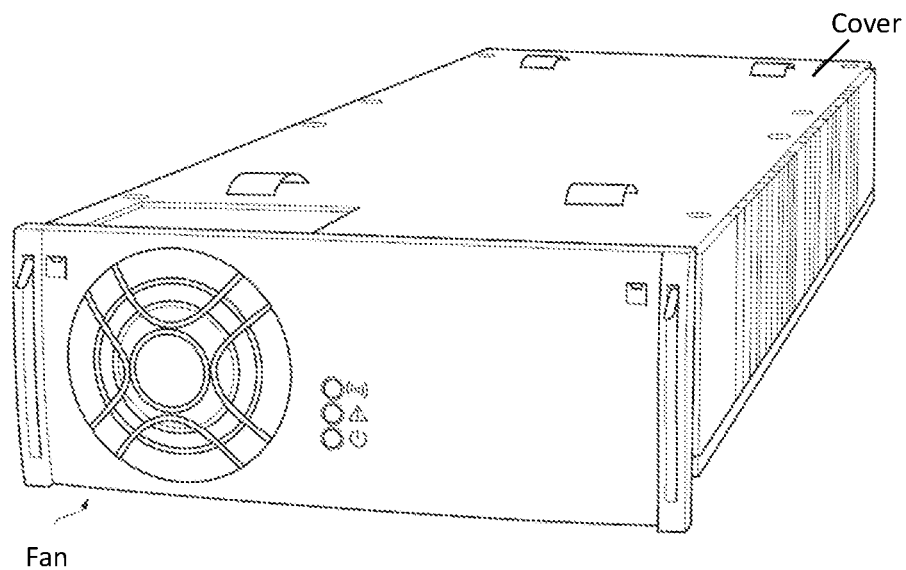
FIG. 2a illustrates a converter module used in the power supply system of FIG. 1.
Figure 2B:
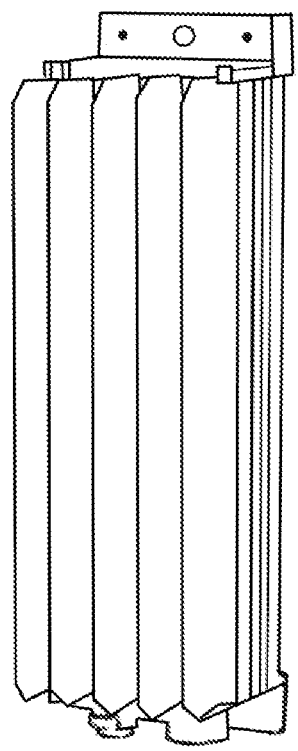
FIG. 2b illustrates a prior art passively cooled converter module.
Figure 2C:
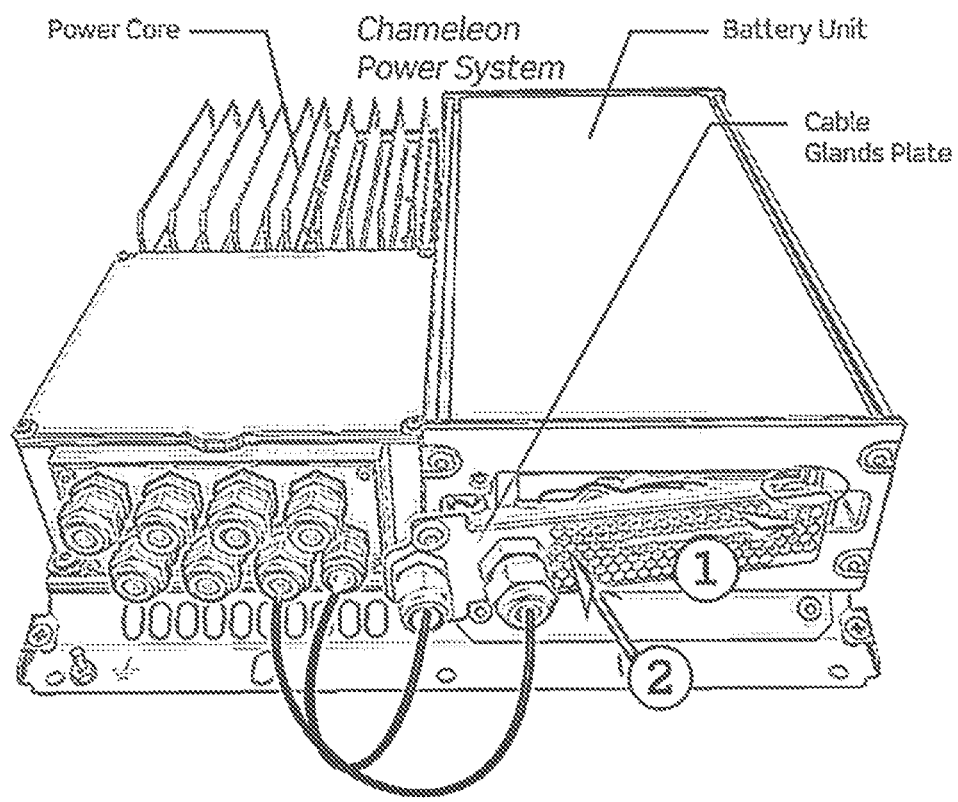
FIG. 2c illustrates a prior art power supply system with two such passively cooled converter modules.
Figure 3A:
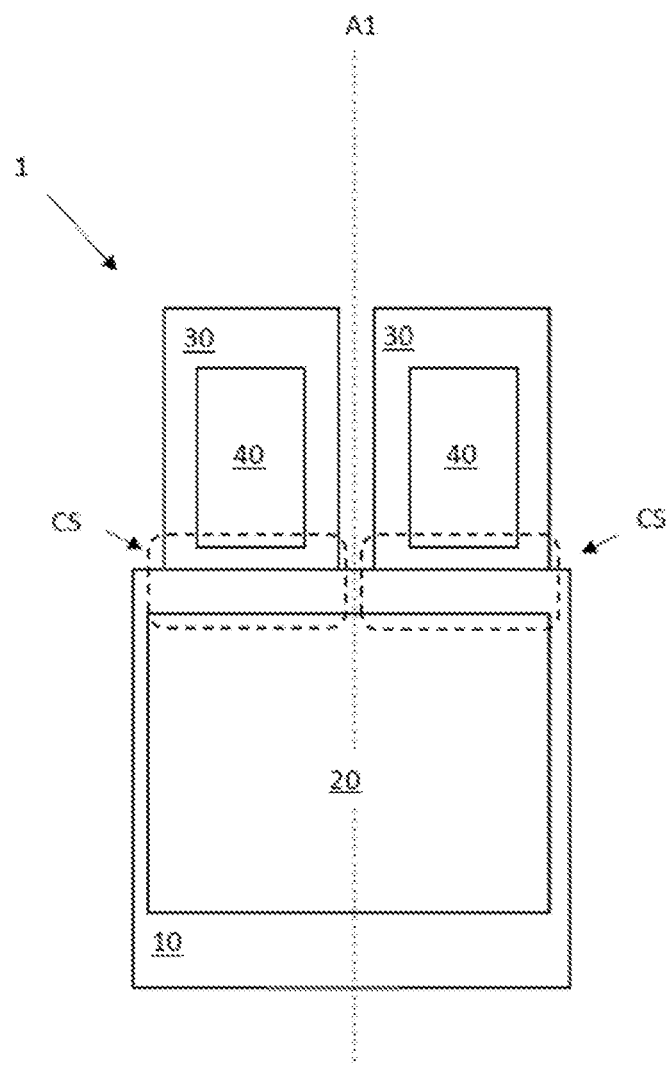
FIG. 3a illustrates schematically a front view of a first embodiment of the power supply system having two module units.

It is now referred to FIG. 3a. Here, a power supply system 1 is illustrated, including a main unit 10 and two module units 30. Each module unit 30 is releasably connected to the main unit 30 by means of a protective connection system indicated by a dashed rectangle CS in FIG. 3a.

The main unit 10 includes a protective main housing 11 and a distribution circuit 20 disposed in the protective main housing 11. Each module unit 30 includes a protective module housing 31 and an electric module 40 disposed in the protective module housing 31.

Figure 4A:
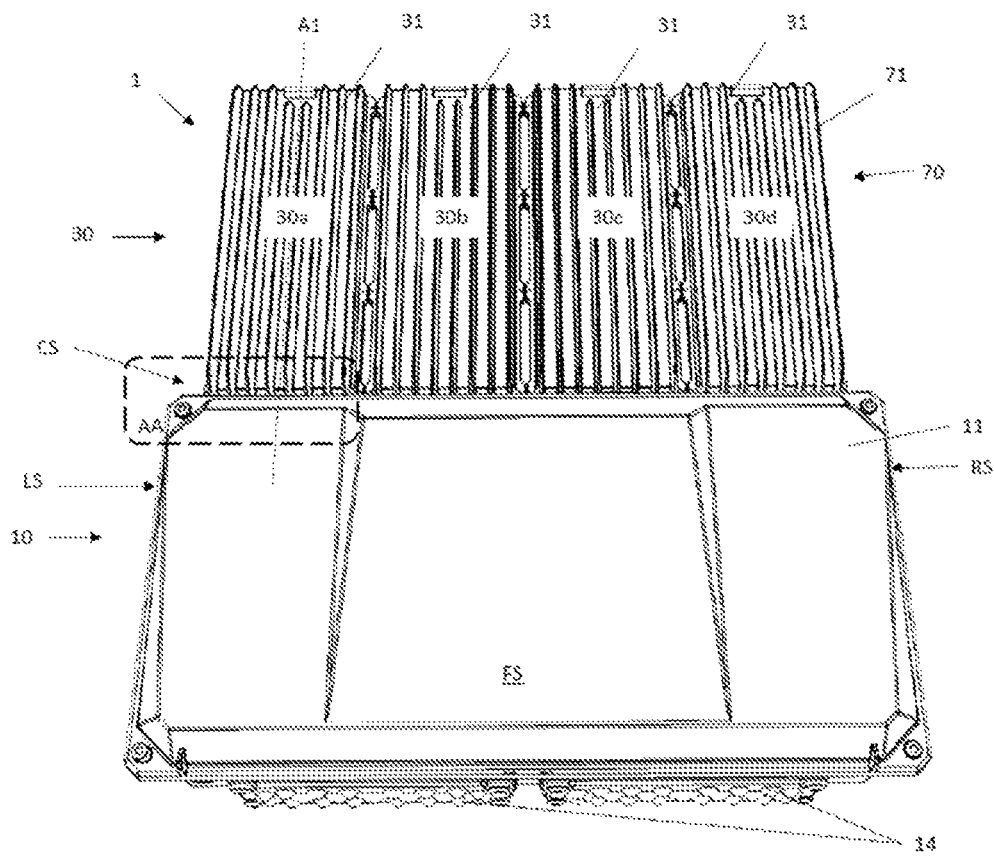
FIG. 4a shows a front view of a first embodiment of an outdoor power supply system.
Figure 4B:
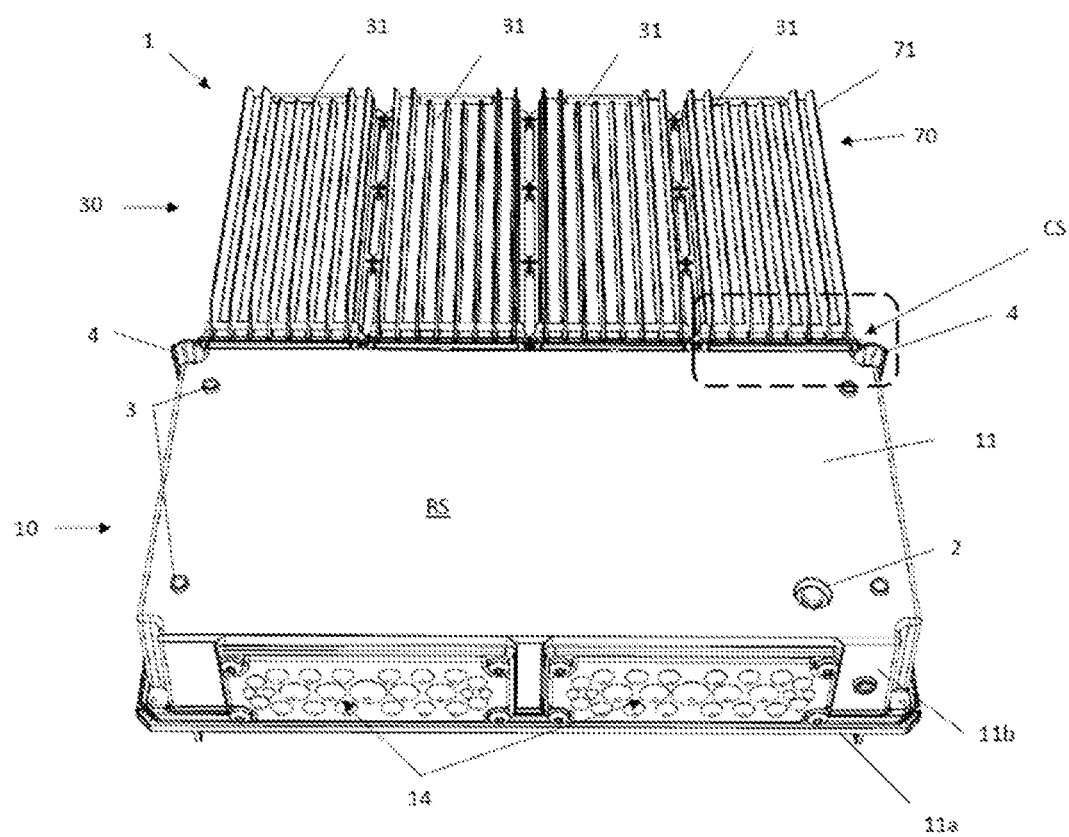
FIG. 4b shows a rear view of the first embodiment.

It is now referred to FIG. 4a and FIG. 4b, in which another embodiment of a power supply system 1 is shown. Here, the main unit 10 is connected to four module units 30a, 30b, 30c, 30d. It should be noted that only one of the connection systems CSs are indicated in FIGS. 4a and 4b. A center axis A1 of the first module unit is also indicated in FIG. 4a. As it will be apparent from the description below, the center axis A1 is typically oriented in the vertical direction when the power supply system 1 is in operation. Based on such an orientation, the main unit 10 is further indicated with its front side FS, left side LS, right side RS and rear side RS in FIGS. 4a and/or 4b.

Only the main housing 11 and the four module housings 31 are shown in FIGS. 4a and 4b. The module housings 31 are shown to be a part of a cooling system 70 with cooling fins 71. This will be described further in detail below.

Figure 9:
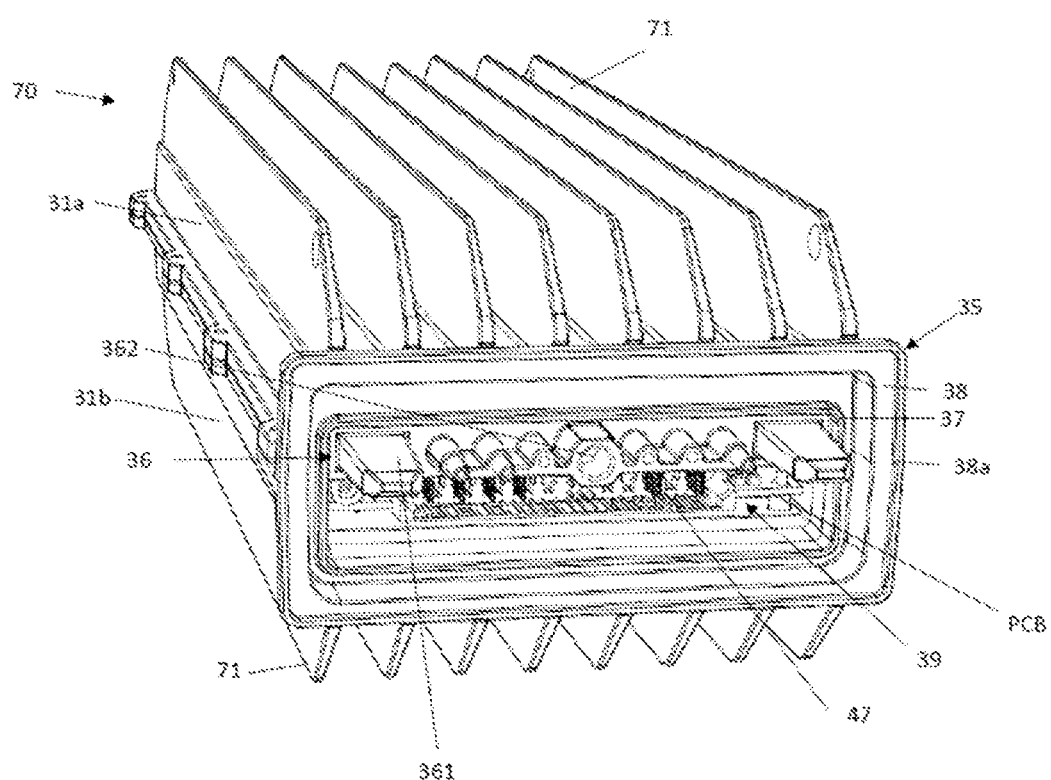
FIG. 9 corresponds to FIG. 8, here the mechanical connector and the electrical connector of the second connection device are shown.

In FIG. 4b, it is shown that the main housing 11 includes a first main housing section 11a and a second main housing section 11b, where the first main housing section 11a is forming the front side FS and the second main housing section 11b is forming the rear side RS. In FIG. 9, it is shown that in similar way, the module housing 31 includes a first module housing section 31a and a second module housing section 31b.

Figure 5:
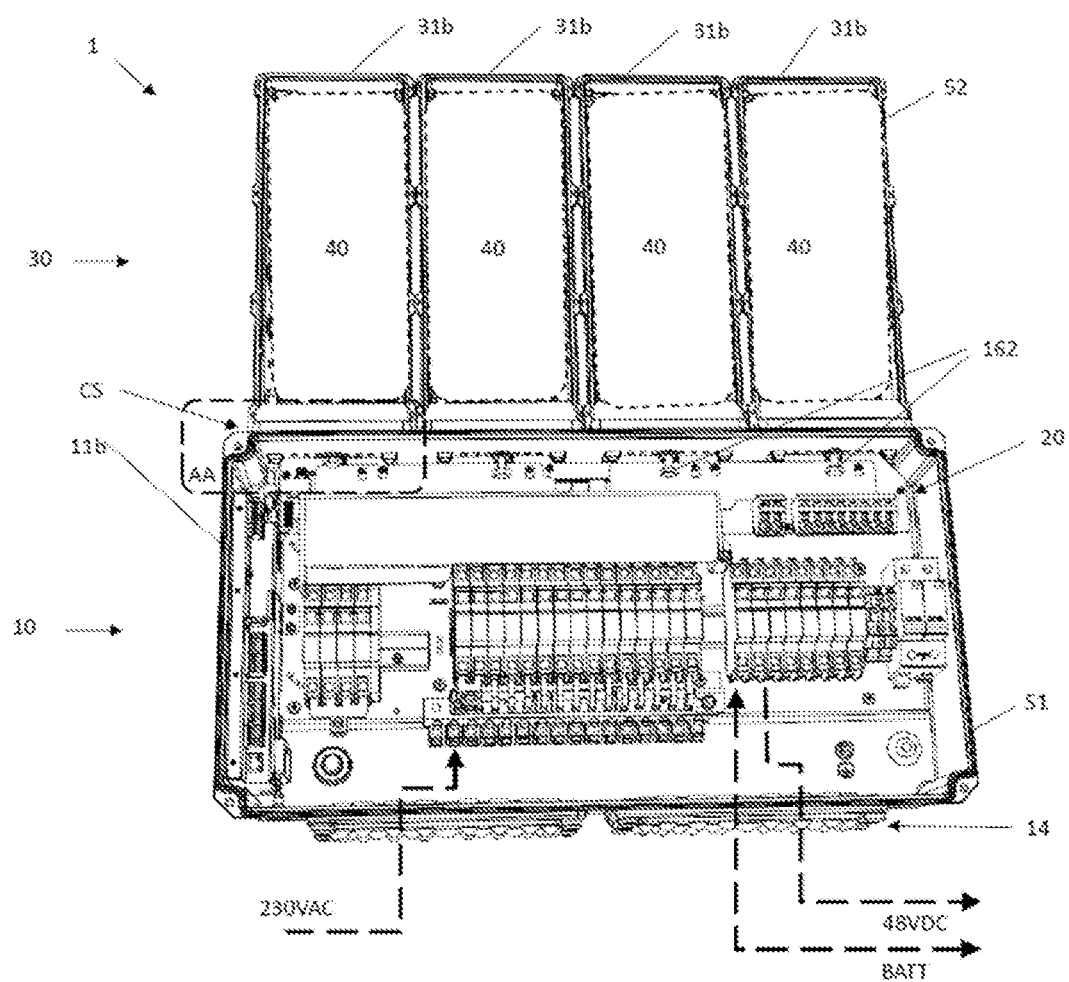
FIG. 5 corresponds to FIG. 3, wherein the upper part of the main housing and the upper part of the respective converter module housings have been removed.

In FIG. 5, the first main housing section 11a of the main unit 10 and the first module housing sections 31a of the respective module units 30 has been removed.

The distribution circuit 20 includes cable connectors, circuit breakers/relays, a controller for controlling power through the converter(s), for controlling the output voltage, for battery management etc. Cables (illustrated by dashed arrows in FIG. 5) are guided from the outside of the main housing 11 to the inside of the main housing 11 via a cable lead-through 14 provided on the bottom face of the main housing 11.

The power supply system 1 further includes a ventilation device 2. The ventilation device 2 equalizes the air pressure within the housings 11, 31 with the air pressure outside of the housings 11, 31. In addition, also air humidity may be equalized towards the environment by means of the ventilation device 2. The ventilation device 2 may include a membrane, for example an expanded Poly Tetra Fluoro Ethylene (PTFE) membrane. Such ventilation devices are sold under the name Gore® Vents and are considered to be well known for a skilled person. The ventilation device 2 may be provided on the rear side of the main housing 11. The power supply system also includes one or more mounting openings 3 for mounting the power supply system 1 to a structure, such as a wall, a pole, a tower etc. The mounting openings 3 may be provided on the rear side of the main housing 11.

The electric module 40 may typically include a converter module, where the input power is power from an AC mains, AC generator or another AC source, a DC power, a variating DC power (for example from one or more solar panels) etc. The output power may be a controlled DC power or a controlled AC power. The system may include only one, two, three or four such units 30, depending on the expected load connected to the power supply system 1. UPS functionality may also be provided by connecting a rechargeable battery to the distribution circuit 20. The rechargeable battery may be located outside of the housings 11, 31 and connected by means of cables, as indicated in FIG. 5. However, in addition to an electric module 40 in the form of a converter module, the power supply system 1 may also include one or several electric modules 40 in the form of rechargeable batteries. In such a case, the rechargeable battery is located within one of the module housings 31.

The power supply system 1 is designed for outdoor use, where the electric components of the distribution circuit 20 and of the electric module 40 are protected from the outside environment by means of the housings 11, 31. Hence, the main housing 11 is considered to be a protective main housing 11 and the module housing 31 is a protective module housing 31. The system 1 may for example have an IP65 classification. Sealing elements 51, 52 are therefore provided between the first and second main housing sections 11a, 11b and between the first and second module housing sections 31a, 31b respectively (shown in FIG. 10).

The cooling system 70 is a passive cooling system, where the module housing 31 is a part of the cooling system 70, where heat is dissipated from the housing 31 to the environment. Also the main housing 11 may be considered to be a part of the cooling system 70. The module housing 31 (and the main housing 11) is therefore made of a thermally conducting material, such as a metal. Preferably, the housing 103 is made of aluminum or an aluminum alloy. The cooling fins 71 of the passive cooling system may be manufactured together with the converter module housing in a die casting process or a machining process.

The present disclosure relates to the connection system CS between the main unit 10 and the module unit 30, and this connection system CS will be described in detail below. It should be noted that in the description below, the connection system CS and other parts of the power supply system 1 will be described as it will be mounted during operation of the power supply system 1, with the axis A1 oriented vertically. With the axis A1 oriented vertically, the cooling system 70 including fins 71 will be able to dissipate heat produced by the power supply system 1 to the environment.

Figure 3B:
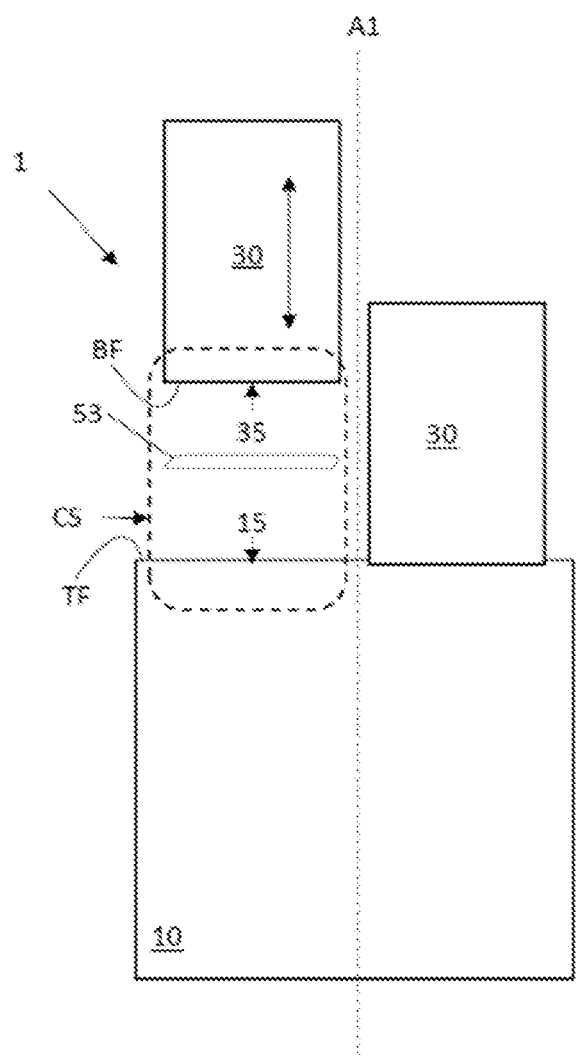
FIG. 3b corresponds to FIG. 3a, where one module unit is disconnected from the main unit and is provided at a distance above the main unit.

It is now referred to FIG. 3b, illustrating the left connection system CS of FIG. 3a. The connection system CS includes a first connector device 15 provided on a top face TF of the protective main housing 11 and a second connector device 35 provided on a bottom face BF of the protective module housing 31. In addition, connection system CS includes a sealing element 53.

Figure 3C:
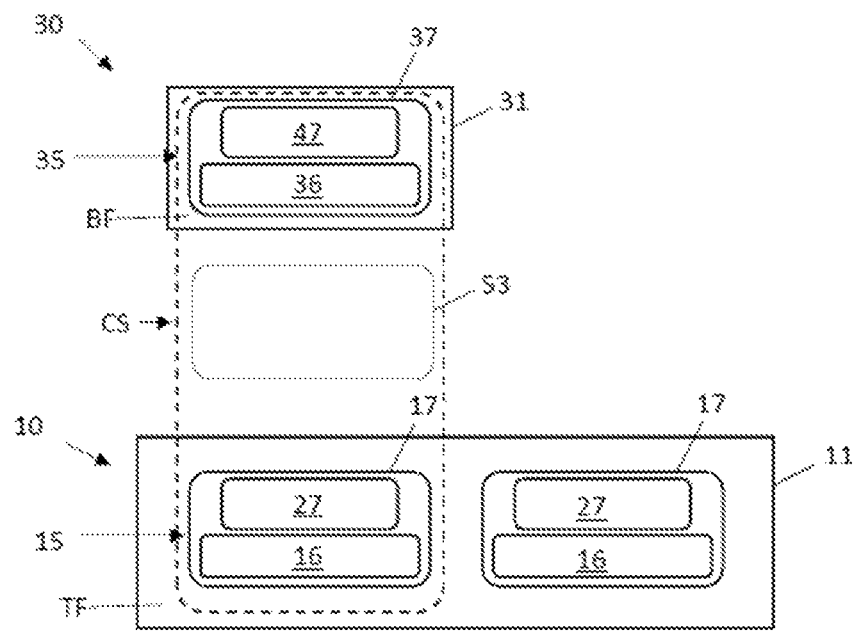
FIG. 3c illustrates schematically a top view of the main unit and a bottom view of one module unit disconnected from each other.

It is now referred to FIG. 3c, showing the bottom face BF of the module unit 30 and the top face TF of the main unit 10. Here it is shown that the first connector device 15 includes a first mechanical connector 16 secured to the protective main housing 11, a first electrical connector 27 connected to the distribution circuit 20 and a first sealing surface 17 circumferentially surrounding the first mechanical connector 16 and the first electrical connector 27. In similar ways, the second connector device 35 includes a second mechanical connector 36 secured to the protective module housing 31, a second electrical connector 47 connected to the converter module 40 and a second sealing surface 37 circumferentially surrounding the mechanical connector 36 and the electrical connector 47.

When the module unit 30 and the main unit 10 are connected to each other, the first mechanical connector 16 and the second mechanical connector 36 are connected to each other and the first electrical connector 27 and the second electrical connector 47 are connected to each other. In addition, the sealing element 53 is sealingly engaged between the first and second sealing surfaces 17, 37.

The Connection System CS of the Module Unit 30

Figure 8:
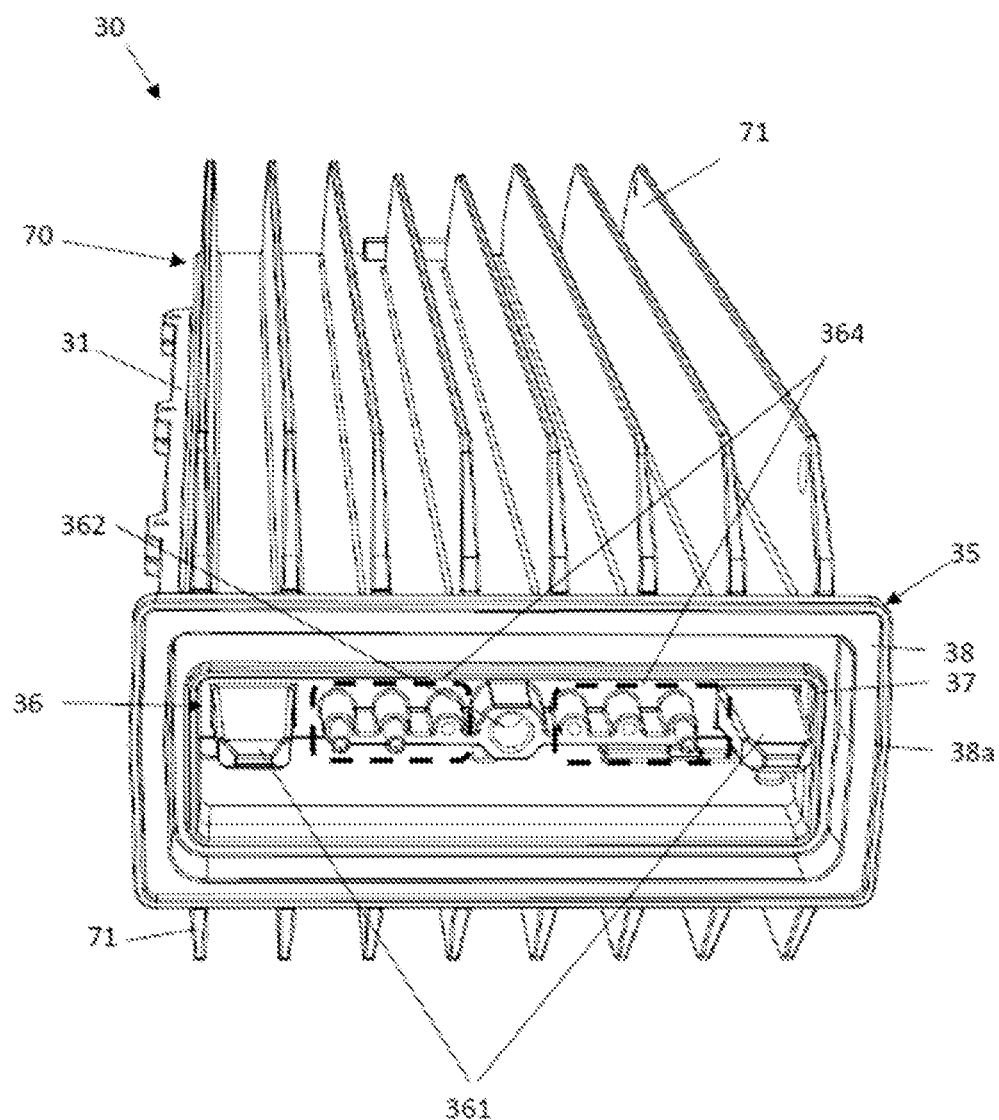
FIG. 8 is a perspective view from below of the module unit with a second connection device of the connection system, wherein only the mechanical connector is shown.

It is now referred to FIG. 8, where the module unit 30 is shown. Here, it is shown that the second mechanical connector 36 includes a securing opening 362. In this embodiment, the securing opening 362 is a threaded opening. The second mechanical connector 36 further includes two guiding elements 361 provided at a distance from each other and provided at a distance from the securing opening 362.

FIG. 9 corresponds to FIG. 8, but here, the second electrical connector 47 is also shown. The second electrical connector 47 includes a number of power connectors for transferring electric power into and out from the module 40, and one or more communication connectors for transferring control signals and sensor signals between the module 40 and the controller of the distribution circuit 20.

In FIG. 8, between the guiding elements 361 and the securing opening 362, the second mechanical connector 36 includes a second part of a mechanical coding system, indicated as 364. The mechanical coding system 364 includes pin openings, wherein pins can be inserted. In FIG. 8, pins are present in positions 1, 2 and 6 (from left to right), while no pins are present in positions 3, 4 and 5.

It is now referred to FIG. 9. The second sealing surface 37 is provided as a part of the protective module housing 31 circumferentially surrounding the second mechanical connector 36 and the second electrical connector 47.

Figure 10:
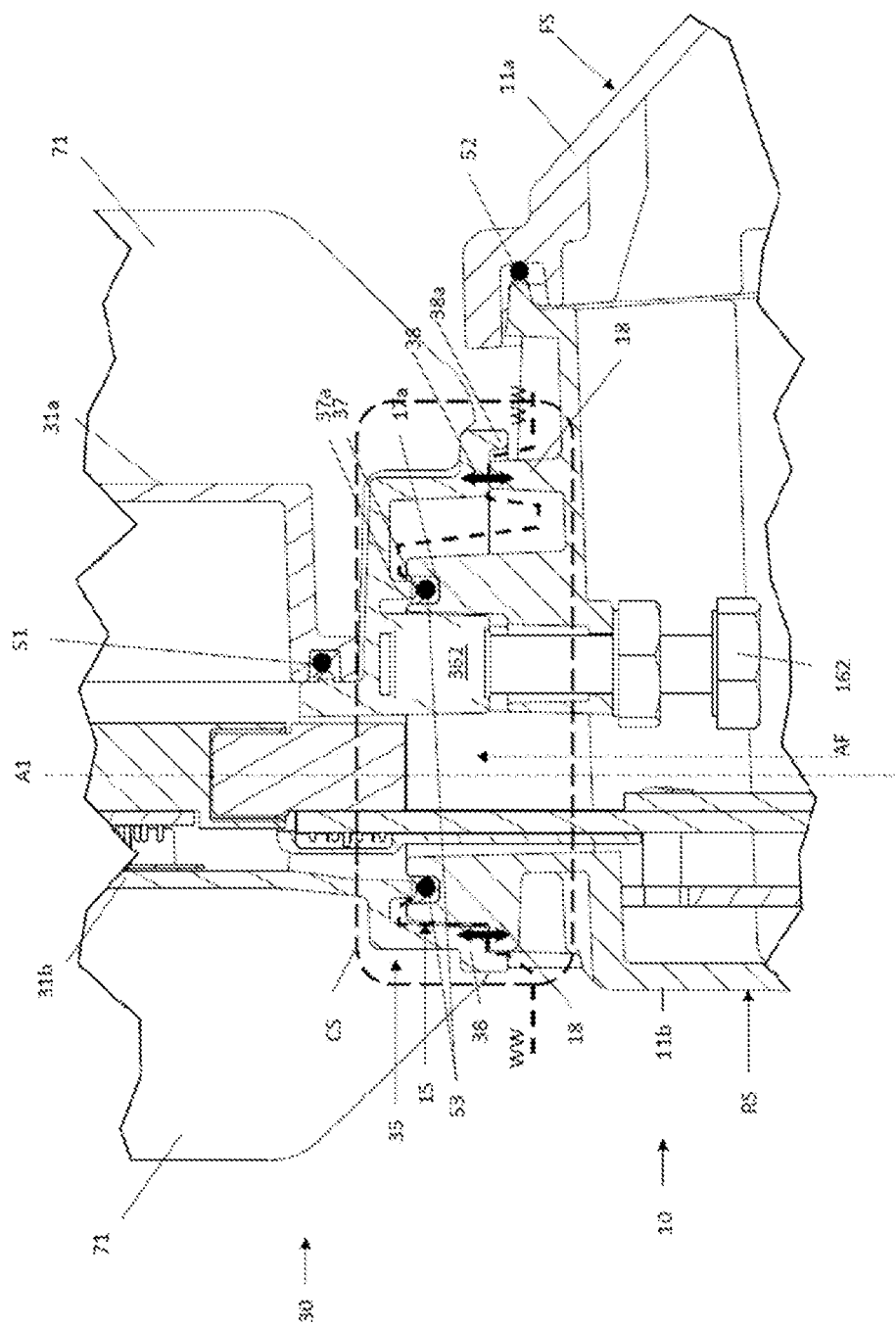
FIG. 10 is a cross section of the main unit and the module unit in the area adjacent to the connection system.
Figure 12:
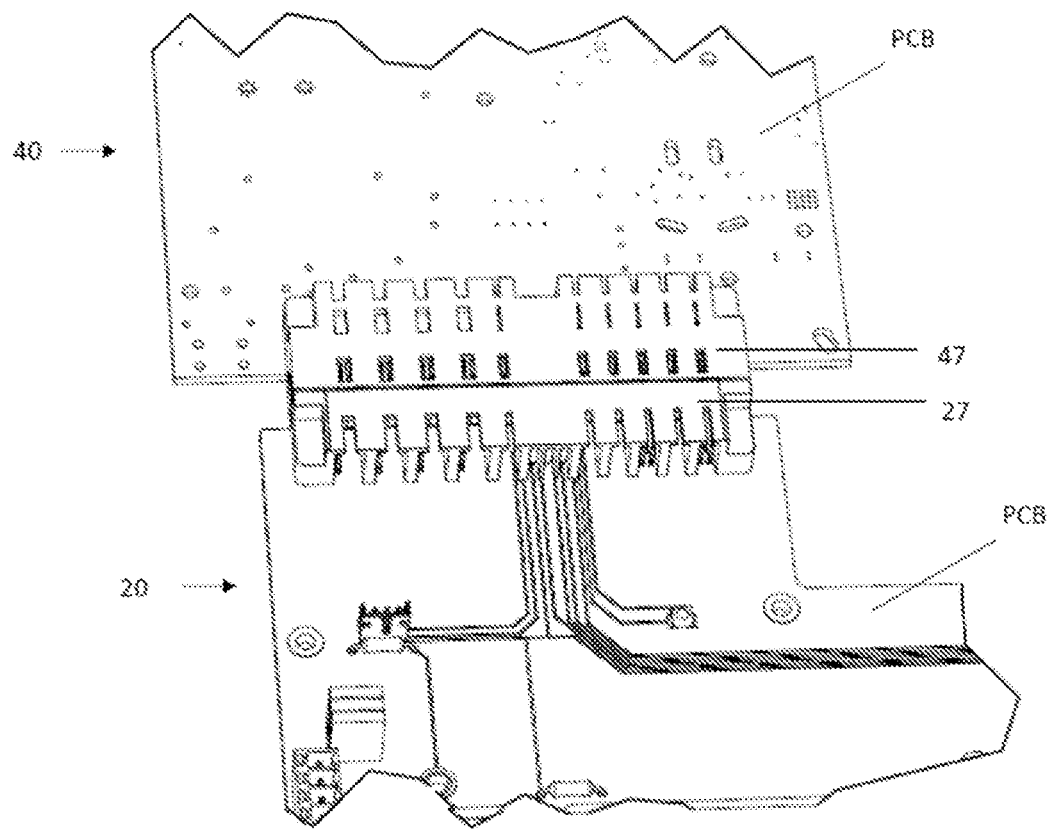
FIG. 12 is an enlarged view of the electrical connectors of the connection system.
Figure 13:
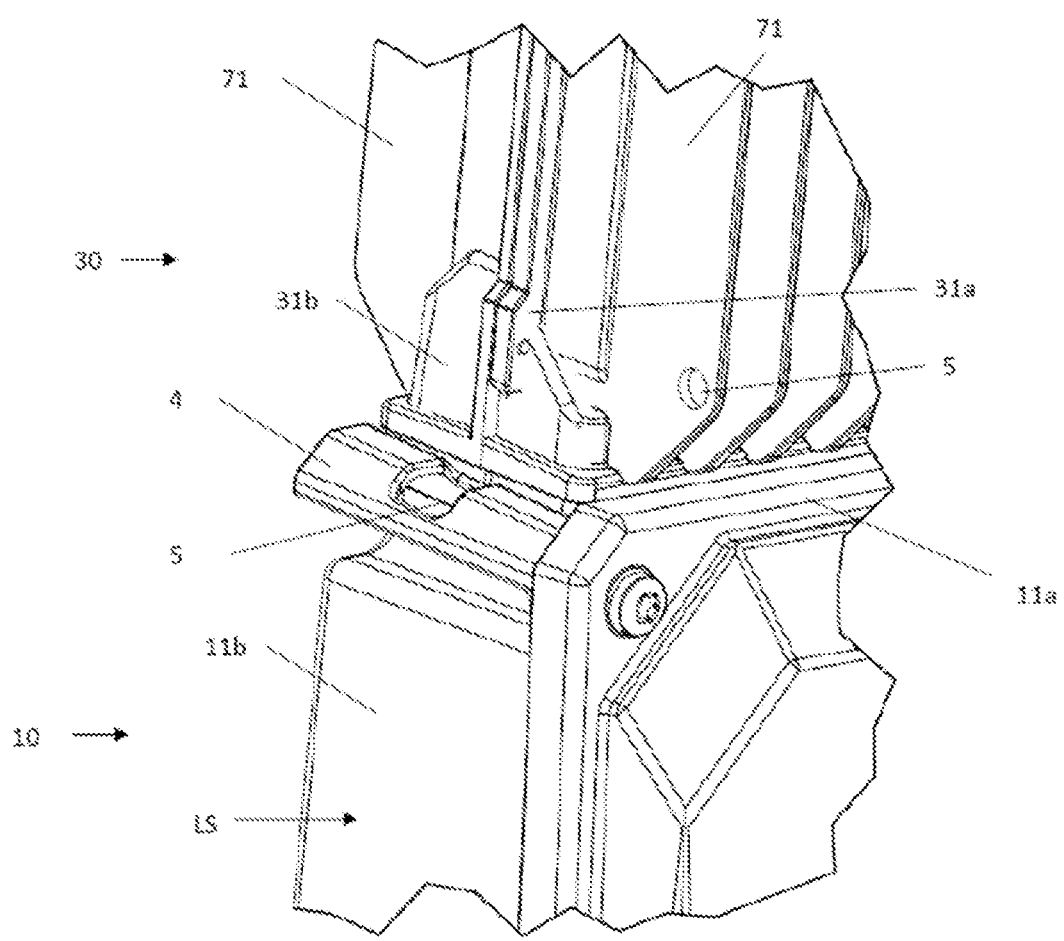
FIG. 13 shows an enlarged view of some details on the left side of the main unit and the module unit.

In FIGS. 9, 10 and 12, it is shown that the second sealing surface 37 is provided as a ridge 37a protruding from the second protecting housing 31 in a direction towards the main housing 11. The ridge 37a is intended to be in contact with the sealing element 53 when the module unit 30 is assembled with the main unit 10.

It is also shown that the second connector device 35 includes a second heat-conducting element 38 circumferentially surrounding the second sealing surface 37. Also the second heat-conducting element 38 is provided as a part of the protective module housing 31.

The second connector device 35 further includes a lip 38a circumferentially surrounding the second heat-conducting element 38, wherein the lip 38*a* is protruding in the axial direction A1 away from the second heat-conducting element 38.

The second connector device 35 may include a second ventilation channel 39 (FIG. 9) or several ventilation channels.

The Connection System CS of the Main Unit 10

Figure 6:
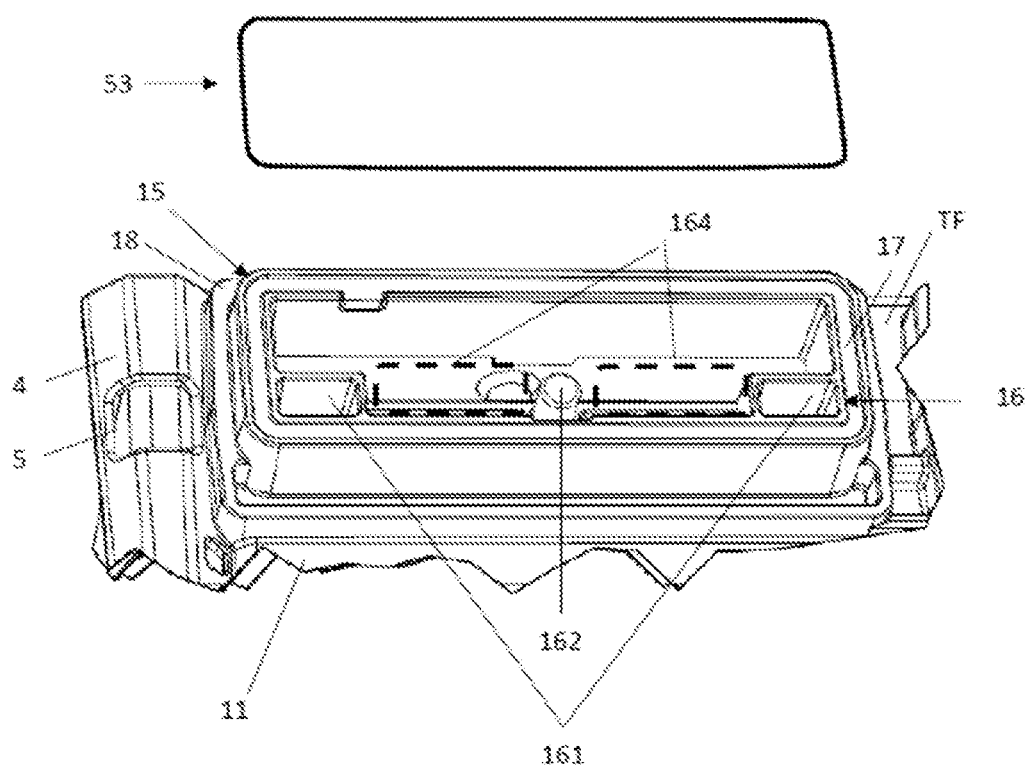
FIG. 6 illustrates the area AA of the main unit shown in FIG. 5 with a first connection device of a connection system, wherein only the mechanical connector is shown.

It is now referred to FIG. 6, showing a part of the top face TF of the main unit 10. Here it is shown that the first mechanical connector 16 includes a securing element 162. In this embodiment, the securing element 162 is a threaded bolt or screw adapted to be secured to the securing opening 362. The first mechanical connector 16 further includes two guiding openings 161 adapted to receive the guiding element 361.

In FIG. 5 and in FIG. 10, it is shown that the securing element 168 is accessible from within the main housing 11.

Figure 7:
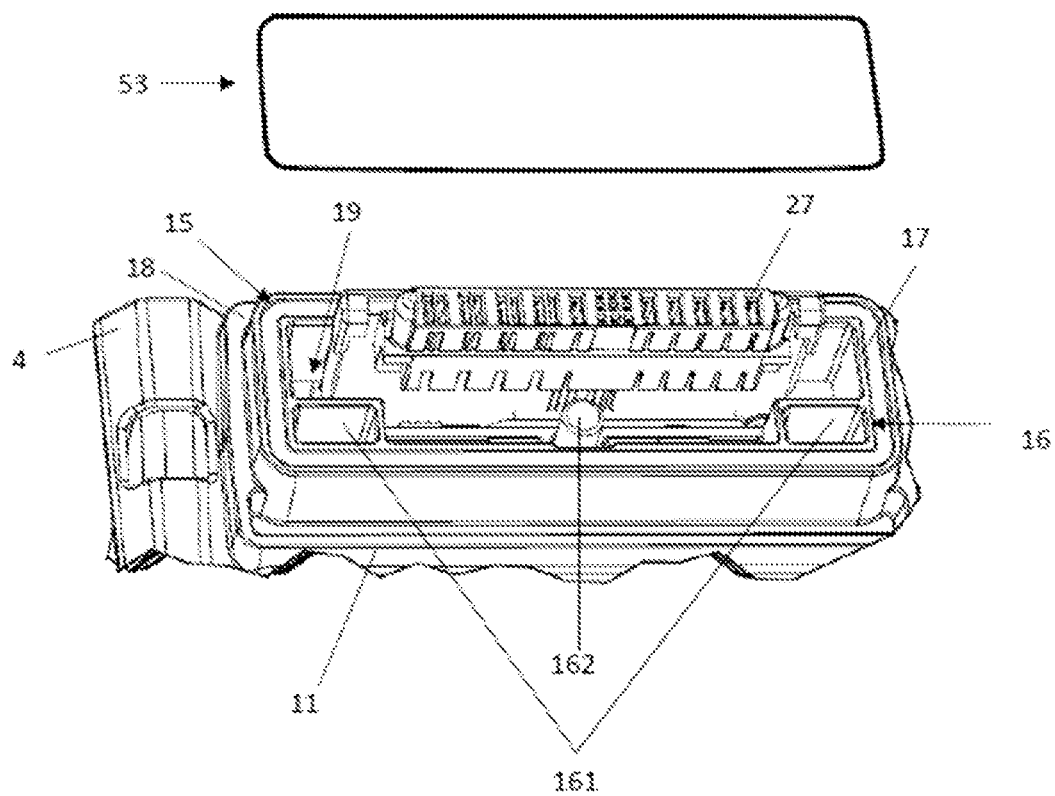
FIG. 7 corresponds to FIG. 6, here the mechanical connector and the electrical connector of the first connection device are shown.

FIG. 7 corresponds to FIG. 6, but here, the first electric connector 27 is shown. The first electric connector 27 is adapted to be connected to the second electric connector 47.

In FIG. 6, between the guiding openings 161 and the securing element 162, the first mechanical connector 16 includes a first part of the mechanical coding system, indicated as 164. The first mechanical coding system 164 includes pin openings, which can be open or blocked. A pin of the second mechanical coding system 364 will fit into an open pin opening of the first mechanical coding system 164, but will not fit into a blocked pin opening of the first mechanical coding system 164.

Hence, if the first part of the mechanical coding system fits the second part of the mechanical coding system, it is possible to connect the module unit 30 to the main unit 10. However, if the first part of the mechanical coding system does not fit the second part of the mechanical coding system, it is not possible to connect the module unit 30 to the main unit 10.

As an example, a 48 VDC output voltage of the power supply system will require a different fuse in the distribution circuit 20 of the main unit 10 than a 400 VDC output voltage. Moreover, connecting a 48 VDC module into a 400 VDC system will cause damage to components (capacitors, semiconductors etc.) within the 48 VDC module. Hence, by means of this mechanical coding system, it is possible to avoid that a converter module having an output voltage of 48 VDC is connected to main unit 10 of a power supply system dimensioned to output 400 VDC only (or vice versa).

In FIG. 7, it is shown that the first sealing surface 17 is provided as part of the protective main housing 11 circumferentially surrounding the first mechanical connector 16 and the first electrical connector 27. The first sealing surface 17 is provided as a groove 17 (FIG. 10) intended to be in contact with the sealing element 53 when the module unit 30 is assembled with the main unit 10.

It is also shown that the first connector device 15 includes a first heat-conducting element 18 circumferentially surrounding the first sealing surface 17. Also the first heat-conducting element 18 is provided as a part of the main housing 11.

The first connector device 15 may also include a first ventilation channel 19 (FIG. 7) aligned with the first ventilation channel 39 when the module unit 30 and the main unit 10 are connected to each other.

Assembly Operation

The operation of connecting the module unit 30 to the main unit 10 will now be described in detail.

However, first the mounting of the main unit 10 will be described shortly, as this is the first step of mounting and installing the power supply system 1. In a first step, the first and second main housing sections 11*a*, 11*b* are released from each other. The distribution circuit 20 is secured to the second main housing section 11*b*. The second main housing section 11*b* (together with the distribution circuit 20) is now mounted to a structure by means of the above mounting openings 3 with its rear side RS facing towards the structure and its top surface TS facing upwardly and the cable lead-through 14 facing downwardly.

Cables may now be guided through the cable lead-through 14 and connected to the distribution circuit 20.

If already not in place, the sealing element 53 is inserted into the groove 17*a* forming the first sealing surface groove 17.

The module unit 30 does not need any assembly/disassembly at this stage. However, a temporary cover may be provided on both the main unit 10 and the module unit 30 for protection during transportation and storage. These temporary covers are now removed.

The module unit 30 is now lifted onto the main unit 10 with its bottom face BF facing downwardly. By inserting the guiding elements 361 into the guiding openings 161, the module unit 30 will be correctly positioned with respect to the main unit 10.

The securing element 162 is now secured to the securing opening 362. In FIG. 10 the securing element 162 is shown both in its lower, disconnected position and its upper, connected and secured position.

The sealing element 53 will now be sealingly engaged in the groove 17*a* as the ridge 37*a* will press the sealing element 53 between the first and second sealing surfaces 17, 37.

In FIG. 12 it is shown how the first electrical connector 27 and the second electrical connector 47 are connected to each other.

Figure 11:
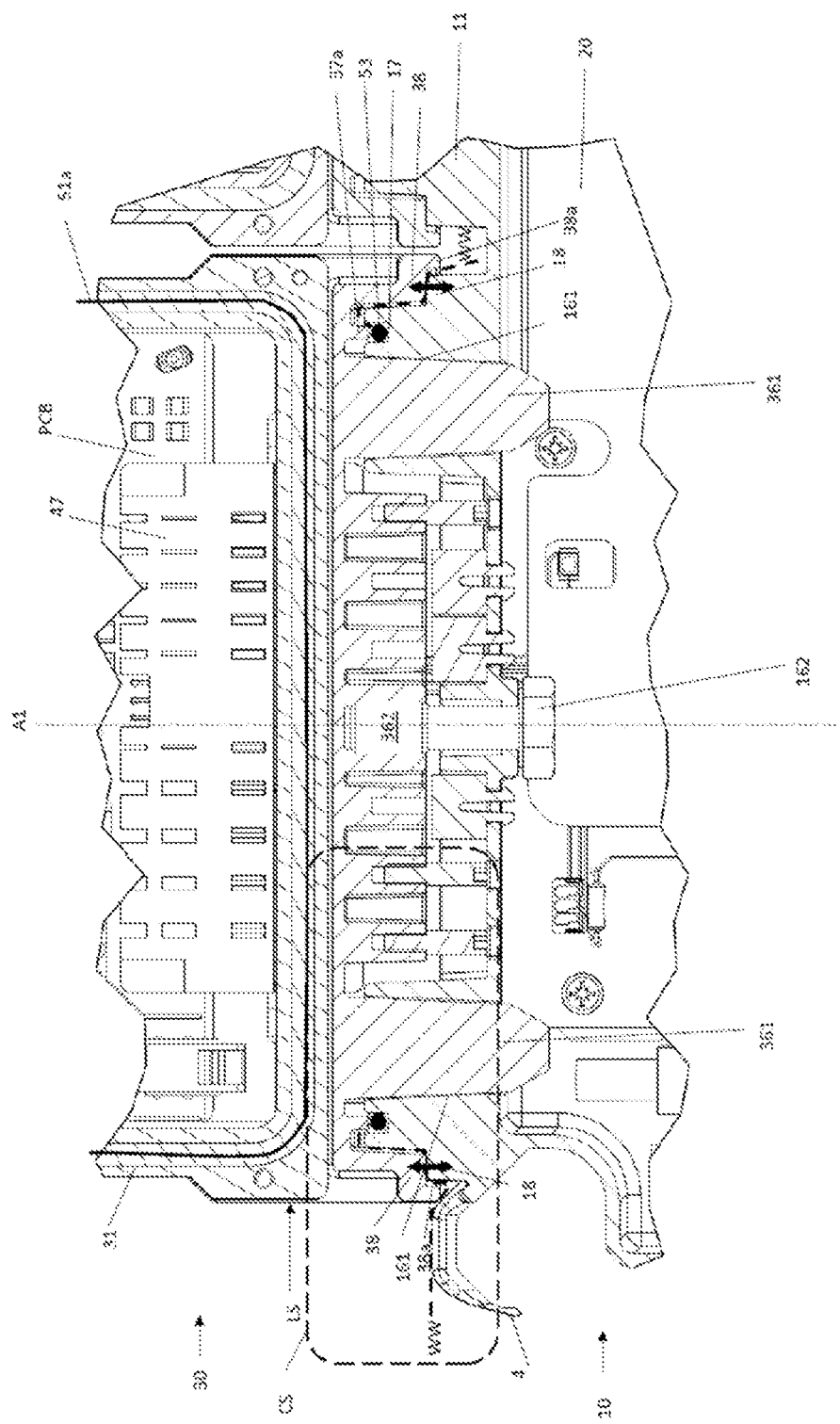
FIG. 11 is a cross section taken perpendicular to the cross section of FIG. 10.

In FIGS. 10 and 11 it is also shown how the first heat conducting element 18 and the second heat-conducting element 38 are pressed into contact with each other. It should be noted that this contact interface is provided vertically below the sealing element 53. Moreover, it is also shown how the lip 38*a* is circumferentially surrounding the second heat-conducting element 38, and also parts of the first heat-conducting element 18.

This has two purposes: First, heat may be transferred between the main housing 11 and the module housing 31 via the first and second heat conducting elements 18, 38. Second, moisture and dust are prevented from reaching the sealing element 53. This is illustrated by a water-way WW indicating how water has to flow upwardly on the outside of the first heat conducting element 18 and inside the lip 38*a*, then between the first and second heat conducting elements 18, 38. Then, if water gets so far, the water must further flow upwardly again and into the groove 18*a*, where the sealing element 53 is located. Hence, the above features of the connection system CS are considered to protect the inside of the housings 11, 31 from water, dust and other weather conditions.

The ventilation channels 19, 39 also allows air to flow between the main housing 11 and the module housing 39. This is indicated as a dashed arrow AF (Air Flow) in FIG. 10.

Then other module units 30 may be connected to the main unit 10. In the examples above, there may be two or four such module units 30 connected to one main unit 10. However, other options are also possible. Moreover, it is also possible to connect only one module unit 30 to the main unit 10 and then blind the remaining openings in the top surface TS of the main unit 10.

In a final step, the first main housing section 11*a* is secured to the second main housing section 11*b*.

In addition to those mentioned above, there are more advantages of this connection system CS. As shown in FIG. 12, both the distribution circuit 20 and the converter module 40 typically includes electric and electronic components soldered to a printed circuit board PCB. Such printed circuit boards and the soldering thereon will easily be damaged if they are bent. According to the mechanical connection system of the power supply system above, mechanical rigidity is ensured.

It should also be noted that the above connection system CS makes it easy to reconfigure the power supply system 1, by replacing one module unit 30 with another module unit 30 (for example due to malfunctioning), to add an additional module unit or to remove one of several module units (if the expected load increases or decreases).

Another advantage is that the first electrical connector 27 may be touch proof. Consequently, an operator may connect the first and second connector devices 15, 35 to each other or disconnect the first and second connector devices 15, 35 from each other, even if the distribution circuit 20 is supplied with power.

Another advantage is that as the securing element 162 is only accessible from within the main housing, the risk of theft or tampering is reduced.

Alternative Embodiments

In yet an alternative, the securing opening is provided as part of the first mechanical connector and the securing element is provided as part of the second mechanical connector. In this alternative, the securing element is accessible from within the protective module housing.

Alternatively, the guiding opening is provided as part of the second mechanical connector and the guiding element is provided as part of the first mechanical connector.

In one aspect, the converter module has a nominal power of 1500-3000 W, preferably 1500-2000 W.

In one aspect, the module unit 30 is configured to convert a first type of power to a second type of power. The first type of power may be a 230 VAC type of power for example supplied from the AC mains, an AC generator etc., a variating DC type of power for example supplied from a solar panel, a fixed DC type of power for example a 400 VDC power. The first type of power may often be referred to as input power inputted to the power supply system.

The second type of power may be a 48 VDC type of power, or another type of power as required by the load. The second type of power may often be referred to as output power outputted from the power supply system.

It should be noted that the converter module 40 may be configured to convert power between more than two types of power. For example, one converter module may convert both a solar DC type of power and an AC type of power to a fixed DC type of power. In addition, bi-directional power converters are commonly known to be able to transfer power in both directions for such converters, it makes less sense to use terms like input/output power In the description above, the term "protective" is referring to how electrical equipment needs to be protected from the outdoor environment, for example from fine particles (dust, sand etc.) and humidity (rain, snow etc.). Hence, the term "protective" may be interpreted as "protective against the outdoor environment". As mentioned in the introduction above, equipment for protection of electrical equipment is classified with Ingress Protection IP code as defined in IEC standard 60529. The embodiments described herein are designed for IP code 65, which is typically required for outdoor power supply systems in Scandinavian countries. Other locations may require other IP codes, for example lower/higher protection against fine particles and lower/higher protection against humidity.

What is claimed is:

1. A power supply system (1), comprising:
   a main unit (10) comprising a protective main housing (11) and a distribution circuit (20) disposed in the protective main housing (11);
   a module unit (30) comprising a protective module housing (31) and an electric module (40) disposed in the protective module housing (31);
   a protective connection system (CS) configured to provide a releasable connection between the module unit (30) and the main unit (10);
   wherein the protective connection system (CS) comprises a first connector device (15), a second connector device (35) and a sealing element (53);
   wherein the first connector device (15) comprises:
   a first mechanical connector (16) configured to be secured to the protective main housing (11);
   a first electrical connector (27) configured to be connected to the distribution circuit (20);
   a first sealing surface (17) circumferentially surrounding the first mechanical connector (16) and the first electrical connector (27);
   wherein the second connector device (35) comprises:
   a second mechanical connector (36) configured to be secured to the protective module housing (31);
   a second electrical connector (47) configured to be connected to the electric module (40);
   a second sealing surface (37) circumferentially surrounding the second mechanical connector (36) and the second electrical connector (47);
   wherein, when the module unit (30) and the main unit (10) are connected to each other:
   the first and second mechanical connectors (16, 36) are connected to each other;
   the first and second electrical connectors (27, 47) are connected to each other; and
   the sealing element (53) is sealingly engaged between the first and second sealing surfaces (17, 37).

2. The power supply system (1) according to claim 1, wherein:
   the second mechanical connector (36) comprises a securing opening (362);
   the first mechanical connector (16) comprises a securing element (162) being secured to the securing opening (362) when the module unit (30) and the main unit (10) are connected to each other;
   the securing element (162) is accessible from within the protective main housing (11).

3. The power supply system (1) according to claim 1, wherein:
   the first mechanical connector (16) comprises a guiding opening (161);
   the second mechanical connector (36) comprises a guiding element (361) being inserted into to the guiding opening (161) when the module unit (30) and the main unit (10) are connected to each other.

4. The power supply system (1) according to claim 1, wherein the first sealing surface (17) is provided as a part of the protective main housing (11), and the second sealing surface (37) is provided as a part of the protective module housing (31).

5. The power supply system (1) according to claim 4, wherein:
the first sealing surface (17) is provided as part of one a groove (17a) or a ridge in the protective main housing (11);
the second sealing surface (37) is provided as the other of a ridge (37a) or a groove protruding from the second protecting housing (31).

6. The power supply system (1) according to claim 1, wherein:
the first connector device (15) comprises a first heat-conducting element (18);
the second connector device (35) comprises a second heat-conducting element (38);
wherein the first and second heat-conducting elements are provided in contact with each other when the module unit (30) and the main unit (10) are connected to each other.

7. The power supply system (1) according to claim 6, wherein the first heat-conducting element (18) is circumferentially surrounding the first sealing surface (17); and
wherein the second heat-conducting element (38) is circumferentially surrounding the second sealing surface (37).

8. The power supply system (1) according to claim 6, wherein the first heat-conducting element (18) is provided vertically below the second heat-conducting element (38) during operation of the power supply system (1).

9. The power supply system (1) according to claim 6, wherein the first heat-conducting element (18) is provided as a part of the protective main housing (11) and the second heat-conducting element (38) is provided as a part of the protective module housing (31).

10. The power supply system (1) according to claim 7, wherein the second connector device (35) comprises a lip (38a) circumferentially surrounding the second heat-conducting element (38), where the lip (38a) is protruding in an axial direction (A1) away from the second sealing surface (37).

11. The power supply system (1) according to claim 1, wherein during operation of the power supply system (1), the first connector device (15) is provided on a top face (TF) of the protective main housing (11) and the second connector device (35) is provided on a bottom face (BF) of the protective module housing (31).

12. The power supply system (1) according to claim 1, wherein during operation of the power supply system (1), the first mechanical connector (16) and the first electrical connector (27) are facing upwardly and the second mechanical connector (36) and the second electrical connector (47) are facing downwardly.

13. The power supply system (1) according to claim 1, wherein during operation of the power supply system (1), the first and second sealing surfaces (17, 37) are oriented in a horizontal plane.

14. The power supply system (1) according to claim 1, wherein:
the first connector device (15) comprises a first ventilation channel (19);
the second connector device (35) comprises a second ventilation channel (39) aligned with the first ventilation channel (19) when the module unit (30) and the main unit (10) are connected to each other.

15. The power supply system (1) according to claim 1, where the system (1) further comprises a passive cooling system (70) for cooling of the main unit (10) and the module unit (20).

16. The power supply system (1) according to claim 15, wherein the passive cooling system (70) comprises cooling fins (71) provided on the outer surface of the protective module housing (31).

17. The power supply system (1) according to claim 1, wherein:
the first mechanical connector (16) comprises a first part (164) of a mechanical coding system;
the second mechanical connector (36) comprises a second part (364) of the mechanical coding system;
connection of the module unit (20) to the main unit (10) is possible only if the first part of the mechanical coding system fits the second part of the mechanical coding system.

18. The power supply system (1) according to claim 1, wherein the electric module (40) comprises an active power converter for converting one type of power to another type of power.

* * * * *